US006255853B1

(12) United States Patent
Houston

(10) Patent No.: US 6,255,853 B1
(45) Date of Patent: *Jul. 3, 2001

(54) INTEGRATED CIRCUIT HAVING DYNAMIC LOGIC WITH REDUCED STANDBY LEAKAGE CURRENT

(75) Inventor: Theodore W. Houston, Richardson, TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/162,865

(22) Filed: Sep. 29, 1998

Related U.S. Application Data

(60) Provisional application No. 60/060,348, filed on Sep. 29, 1997.

(51) Int. Cl.[7] .................................................. H03K 19/096
(52) U.S. Cl. .................................. 326/98; 326/98; 326/93; 326/95; 326/83; 326/121
(58) Field of Search .................................. 326/98, 95, 93, 326/96, 97, 83, 119, 121, 112

(56) References Cited

U.S. PATENT DOCUMENTS

| | | | |
|---|---|---|---|
| 4,859,870 | * 8/1989 | Wong et al. ........................ 307/263 |
| 5,525,916 | * 6/1996 | Gu et al. ................................ 326/98 |
| 5,838,170 | * 11/1998 | Schorn .................................... 326/98 |
| 5,880,609 | * 3/1999 | Klass et al. ........................... 326/93 |
| 6,002,271 | * 12/1999 | Chu et al. .............................. 326/98 |

* cited by examiner

Primary Examiner—Michael Tokar
Assistant Examiner—Vibol Tan
(74) Attorney, Agent, or Firm—Wade James Brady, III; Frederick J. Telecky, Jr.

(57) ABSTRACT

An integrated circuit (10) is disclosed that has a dynamic logic stage (12) with reduced standby leakage current. The integrated circuit (10) includes a logic gate (20) coupled to a dynamic node (NODE 1) of the dynamic logic stage (12). The logic gate (20) has a first voltage supply terminal and a second voltage supply terminal. The logic gate (20) consumes standby leakage current when the dynamic logic stage (12) is not in an evaluation phase or when the clock is idle. A transistor (30) has a source connected to a first voltage supply, a drain connected to the first voltage terminal of the logic gate, and a gate connected to a control signal. The drain of the transistor (30) provides an intermediate node (NODE 4) for supplying voltage to the logic gate (20). The transistor (30) is operable to be turned off by the control signal when the dynamic logic stage (12) is not in an evaluation phase or the dynamic logic section is in standby such that the transistor (30) reduces the standby leakage current of the logic gate (20). In addition, a sub-circuit, such as transistor (34), can be used to limit the voltage difference between the first voltage supply and a voltage level of the intermediate node (NODE 4).

32 Claims, 4 Drawing Sheets

INTEGRATED CIRCUIT HAVING DYNAMIC LOGIC WITH REDUCED STANDBY LEAKAGE CURRENT

This application claims priority under 35 USC §119(e)(1) of provisional application No. 60/060,348 filed Sep. 29, 1997.

TECHNICAL FIELD OF THE INVENTION

This invention relates in general to the field of integrated circuits, and more particularly to an integrated circuit having dynamic logic with reduced standby leakage current.

BACKGROUND OF THE INVENTION

Domino logic stages are used in integrated circuits to provide high-speed logic functionality. In general, domino logic involves the charging of dynamic nodes during a precharge phase. Subsequently, during an evaluation phase, inputs are fed to the logic stage which may or may not evaluate to provide a path to the low voltage supply from one or more of the dynamic nodes. The dynamic nodes represent a logic high or a logic low depending on whether or not a path to the low voltage supply is formed. Generally, the dynamic node is connected to the input of a static gate (e.g., an inverter), and the output of the static gate is input to other dynamic gates. In this manner, logic can propagate through successive dynamic logic stages. Because high logic levels are precharged, the logic evaluation period is reduced in time. Active power in a domino or dynamic logic block can be reduced by slowing or stopping the clock, but leakage currents in the dynamic and static portions of the dynamic logic section will persist and contribute to power consumption.

One problem that can occur with domino logic is that current leakage can occur through connected logic gates during the precharge phase or other standby period. For example, where each dynamic node feeds an inverter, there can be leakage through transistors within the inverter during the period of time that the dynamic node is precharged high. With the input to the inverter at a logic high, leakage can occur, for example, through the inverter's P-channel transistor which is coupled to the high voltage supply. This leakage is particularly problematic where inverters or other logic gates employ low threshold voltage transistors in order to provide higher speed operation. The low threshold voltage transistors experience higher leakage current for a given gate voltage, thus they cause more of a problem.

One conventional solution to the problem of leakage current is to avoid using low threshold voltage transistors where problems occur. Thus, for example, a high threshold voltage P-channel transistor can be used in an inverter to avoid leakage current. Another conventional solution is to shut off power to an entire dynamic logic section including the dynamic gates and associated static logic gates to avoid any leakage current from that section. However, these conventional solutions suffer from problems in that it is undesirable to use high threshold voltage transistors, and it is undesirable to recharge all the dynamic nodes every time the power supply is turned back on. For example, if a dynamic node and the output of the associated static gate both go low in standby, one or the other will have to be recharged high in restart.

SUMMARY OF THE INVENTION

In accordance with the present invention, an integrated circuit having dynamic logic with reduced standby leakage current is provided that provides advantages over conventional dynamic logic circuits.

Knowledge of the state of the dynamic node and its associated static logic gate in relation to the clock signal or standby condition is used to selectively include a first transistor between the dynamic logic gate and a first voltage supply and/or include a second transistor between the associated static gate and a second voltage supply.

In accordance with one aspect of the present invention, an integrated circuit is disclosed that has a dynamic logic stage with reduced standby leakage current. The integrated circuit includes a logic gate coupled to a dynamic node of the dynamic logic stage. The logic gate has a first voltage supply terminal and a second voltage supply terminal. The logic gate consumes standby leakage current when the dynamic logic stage is not in an evaluation phase or when the clock is idle. A transistor has a source connected to a first voltage supply, a drain connected to the first voltage terminal of the logic gate, and a gate connected to a control signal. The drain of the transistor provides an intermediate node for supplying voltage to the logic gate. The transistor is operable to be turned off by the control signal when the dynamic logic stage is not in an evaluation phase or the dynamic logic section is in standby such that the transistor reduces the standby leakage current of the logic gate. In addition, a sub-circuit, such as a transistor, can be used to limit a voltage difference between the high voltage supply and a voltage level of the intermediate node.

According to another aspect of the present invention, the standby leakage current of a dynamic logic stage is reduced. A first transistor used to enable the dynamic logic stage has a drain connected to the dynamic logic stage, a source connected to an intermediate node and a gate connected to a clock signal for the dynamic logic stage. A second transistor has a source connected to a first voltage supply, a drain connected to the intermediate node, and a gate connected to a control signal such that the intermediate node provides a first voltage supply for the dynamic logic stage. The second transistor is operable to be turned off by the control signal when the dynamic logic stage is not in an evaluation phase or when the dynamic section is in standby. The second transistor thereby reduces the standby leakage current of the dynamic logic stage. In addition, a sub-circuit, such as a transistor, can be used to limit a voltage difference between the first voltage supply and a voltage level of the intermediate node.

A technical advantage of the present invention is the ability to have a dynamic node feeding a static logic gate and reduce leakage current through the static logic gate by including a transistor between the logic gate and the voltage supply. In particular, a P-channel transistor can be used in series between an inverter and a positive power supply, $V_{DD}$, and controlled in order to shut off leakage current with little degradation of performance.

Another technical advantage of the present invention is the limiting of a voltage difference between a power supply and an intermediate node supplying logic gates such that start-up does not require significant charging of nodes within the dynamic logic. In particular, a keeper transistor can be connected to the intermediate node to keep it from dropping too low and to allow fast start-up for the dynamic logic stage.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Figure 1:
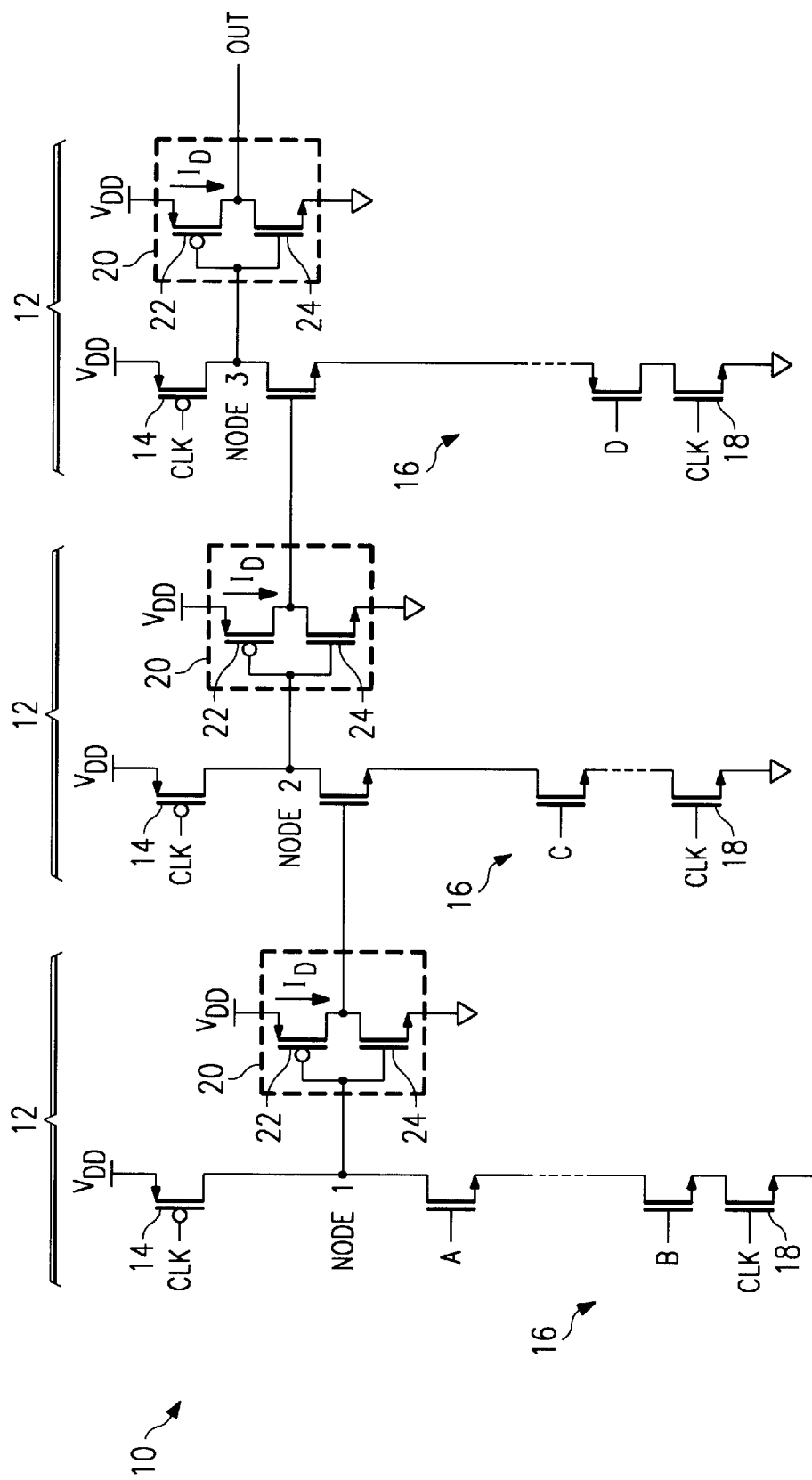
FIG. 1 is a circuit diagram of one embodiment of conventional dynamic logic.

FIG. 1 is a circuit diagram of one embodiment of conventional dynamic logic on an integrated circuit. As shown, dynamic logic, indicated generally at 10, can include a plurality of dynamic logic stages 12. Each dynamic logic stage 12 can include a clocked transistor 14 which can be used to control charging of a dynamic node (NODE 1, NODE 2 or NODE 3, respectively). In the embodiment of FIG. 1, each transistor 14 is a P-channel transistor and has a source connected to the high voltage supply, $V_{DD}$, a drain connected to the dynamic node (NODE 1, NODE 2 or NODE 3) and a gate connected to a control signal, CLK. Each dynamic node (NODE 1, NODE 2 or NODE 3) is connected to a plurality of logic transistors, indicated generally at 16, which receive logic inputs. In the illustrated embodiment, logic transistors 16 comprise N-channel transistors that provide potential paths to the low voltage supply provided all the inputs to a path are at a logic high during evaluation. If so, the dynamic node is connected to the low voltage supply and brought to a logic low. Otherwise the dynamic node remains at a logic high.

The logic transistors 16 in each dynamic logic stage 12 are connected to an enabling transistor 18 which is connected to the low voltage supply and controlled by the control signal, CLK. Each transistor 18 is an N-channel transistor and has a drain connected to the logic transistors 16, a source connected to the low voltage supply and a gate connected to the control signal, CLK. In the illustrated embodiment, each dynamic logic stage 12 has its respective dynamic node connected to the input of an inverter 20. As shown, each inverter 20 can comprise a P-channel transistor 22 and an N-channel transistor 24. P-channel transistor 22 has a source connected to high voltage supply, $V_{DD}$ a gate connected to the dynamic node (NODE 1, NODE 2 or NODE 3) and a drain connected as an input to the next dynamic logic stage 12 or as an output, OUT. N-channel transistor 24 has a drain connected to the drain of P-channel transistor 22, a gate connected to the dynamic node (NODE 1, NODE 2 or NODE 3), and source connected to the low voltage supply.

In operation, the dynamic logic 10 of FIG. 1 is precharged during a precharge phase in which the control signal, CLK, is low. During this time, transistors 14 are turned on and transistors 18 are turned off. This allows the respective dynamic nodes, NODE 1, NODE 2 and NODE 3, to be charged to a logic high. During the precharge phase, the input to each inverter 20 is at a logic high and the output is a logic low. Thus for the inverters 20, it is the leakage through transistors 22 that is of concern during precharge. Also during this time, logic transistors 16 are disconnected from the low voltage supply by transistors 18 being off. The evaluation phase comprises the CLK signal being at a logic high. This turns off transistors 14 and turns on transistors 18. Subsequently, inputs to each set of logic transistors 16 either connects the dynamic node to ground potential or keeps the dynamic node unconnected. The logic results then propagate through dynamic logic stages 12 to provide an output.

Typically, it is advantageous to use low threshold voltage transistors within inverters 20 to provide higher speed operation during the subsequent evaluation phase. However, during the precharge phase or other standby period, there is leakage, indicated generally as drain current, $I_D$, through P-channel transistors 22. The leakage current is augmented by the use of low threshold voltage transistors for P-channel transistors 22. Leakage current, $I_D$, can be drawn from the high voltage supply, $V_{DD}$, and can cause problems for dynamic logic 10 in terms of standby power consumption.

Figure 2:
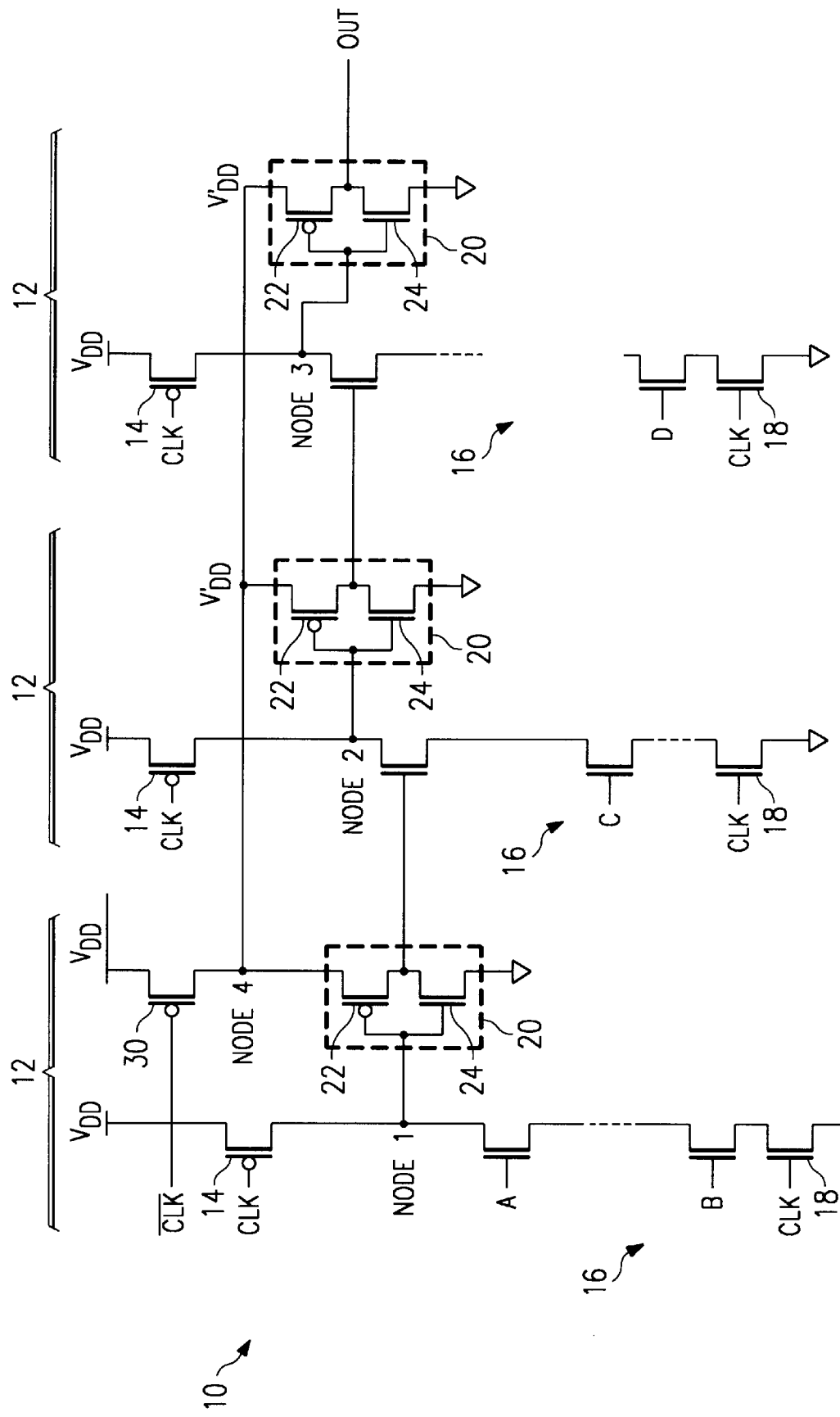
FIG. 2 is a circuit diagram of one embodiment of using a leakage current reducing transistor to reduce standby leakage current according to the teachings of the present invention.

FIG. 2 is a circuit diagram of one embodiment of using a leakage current reducing transistor to reduce standby leakage current according to the teachings of the present invention. In the embodiment of FIG. 2, a leakage current reducing transistor 30 has been added in series between the high voltage supply, $V_{DD}$ and the source of each P-channel transistors 22. Transistor 30 can comprise a P-channel transistor having a source connected to the high voltage supply, $V_{DD}$, a drain connected to NODE 4, and a gate connected to the control signal $\overline{CLK}$. Transistor 30 can be constructed such that it has a higher threshold voltage and lower leakage current than each of the transistors 22. During the precharge phase or other standby period, transistor 30 is turned off by $\overline{CLK}$ and only allows its leakage current to pass to NODE 4. Consequently, the leakage current through transistors 22 is reduced due to the leakage current of transistor 30. This provides an advantage over conventional dynamic logic in that transistor 30 reduces power consumption from standby leakage while allowing transistors 22 to be constructed as low threshold voltage transistors for speed.

During the evaluation phase, transistor 30 is turned on and provides an effective power supply, $V'_{DD}$, for inverters 20. The inverted clock signal $\overline{CLK}$, can be used for gating transistor 30 because the clock will change and transistor 30 will be turned on before logic propagates through dynamic logic stages 12 into inverters 20. Transistor 30 can be designed to provide sufficient current to NODE 4 to drive inverters 20 and not adversely affect the function of inverters 20. It should be understood that transistor 30 can be shared among inverters 20 as shown in FIG. 2. Alternatively, leakage current reducing transistors can be distributed such that there is a transistor 30 for each inverter 20. Further, it should be understood that the present invention applies to other implementations of dynamic logic and other forms of logic gates between each stage. As another alternative, transistor 30 can be constructed as a low threshold voltage transistor but provide leakage current reduction because it is distributed across multiple inverters 20. In this case, each inverter 20 will not pull as much standby leakage current as it would otherwise have pulled because the total current is reduced by transistor 30. Leakage current is also reduced because of the effect of two transistors in series.

Another problem that can occur for long precharge phases or standby periods is that the voltage at NODE 4 can slowly drop from the high voltage supply, $V_{DD}$, due to leakage through inverters 20. This problem can be addressed by using a keeper transistor to prevent too large a difference at NODE 4. Such a keeper transistor could be added to the embodiment of FIG. 2 (although not shown) and is shown and described in the embodiments of FIG. 3 and FIG. 4.

Figure 3:
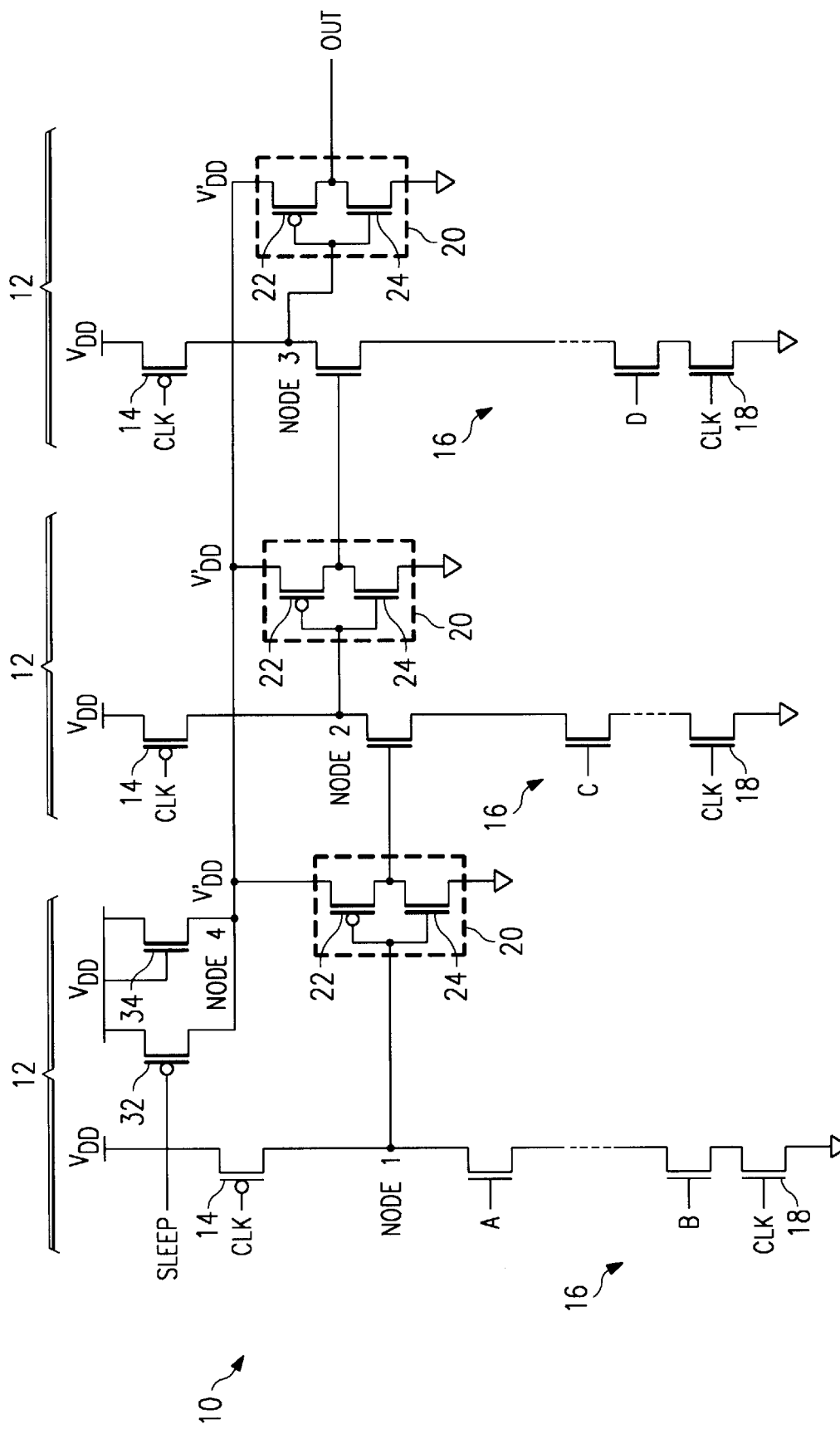
FIG. 3 is a circuit diagram of one embodiment of using both a leakage current reducing transistor to reduce standby leakage current and a keeper transistor to limit the voltage difference at an intermediate node according to the teachings of the present invention.

FIG. 3 is a circuit diagram of one embodiment of using both a leakage current reducing transistor to reduce standby leakage current and a keeper transistor to limit the voltage difference at an intermediate node according to the teachings of the present invention. FIG. 3 also illustrates the use of a sleep control signal to control power to the static logic gates. As shown in FIG. 3, a leakage current reducing transistor 32 and a keeper transistor 34 are used to prevent leakage current through inverters 20 and to maintain the voltage level at NODE 4. According to the present invention, P-channel transistor 32 has a source connected to the high voltage supply, $V_{DD}$, a drain connected to NODE 4 and a gate connected to a control signal, SLEEP. Further, N-channel transistor 34 has a drain and a gate connected to the high voltage supply, $V_{DD}$, and a source connected to NODE 4.

Transistor 32 operates similar to transistor 30 of FIG. 2. However, transistor 32 is gated by the control signal, SLEEP. This control signal performs a different function than that of the inverted clock signal, $\overline{CLK}$, of FIG. 2. The sleep control signal is generally used to put dynamic logic 10 in an extended standby or sleep mode.

Through the operation of transistor 32, the leakage current is reduced to prevent standby power consumption as was discussed above. Also, in sleep mode, it is possible for the charge on NODE 4 to leak away even with small leakage current through transistors 22 and 24. Consequently, according to the present invention, keeper transistor 34 is optionally used to limit the voltage difference between high voltage supply, $V_{DD}$, and the intermediate node, NODE 4. As can be seen, when the voltage level NODE 4 drops below a threshold voltage below $V_{DD}$, transistor 34 turns on and recharges NODE 4. The present invention thereby provides fast wake up from a sleep condition with less use of dynamic power because the voltage level at NODE 4 is not allowed to drift further than a threshold voltage away from the high voltage supply $V_{DD}$.

Figure 4:
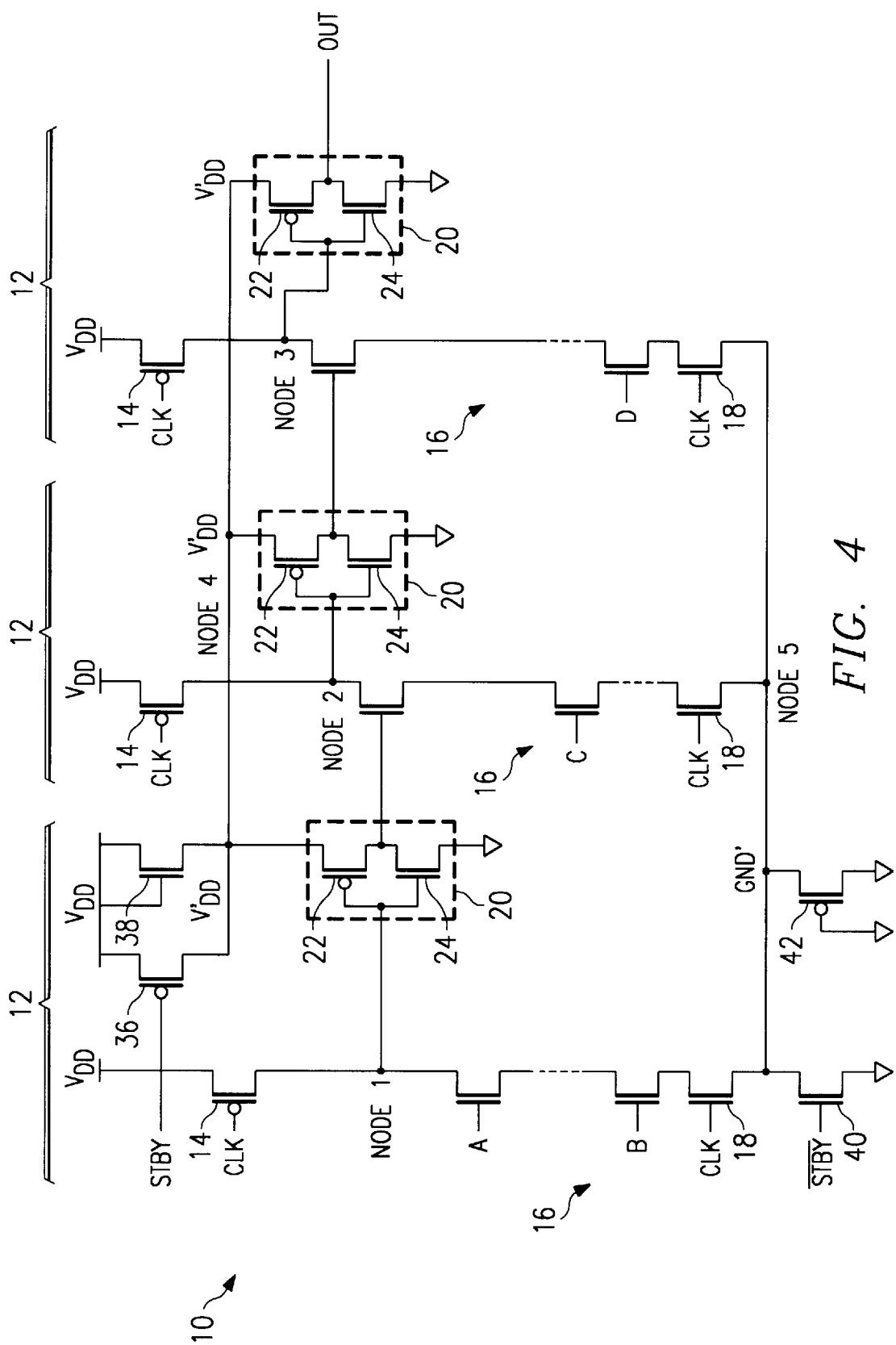
FIG. 4 is a circuit diagram of one embodiment of using leakage current reducing transistors and keeper transistors on both the high voltage supply and low voltage supply according to the teachings of the present invention.

FIG. 4 is a circuit diagram of one embodiment of using leakage current reducing transistors and keeper transistors on both the high voltage supply and low voltage supply according to the teachings of the present invention. FIG. 4 also shows the use of a standby control signal to temporarily halt operation of the dynamic logic. As shown, a leakage current reducing transistor 36 and a keeper transistor 38 are connected to high voltage supply, $V_{DD}$, and gated by a standby control signal, STBY. Similarly, a leakage current reducing transistor 40 and a keeper transistor 42 are connected between the low voltage supply and a fifth node, NODE 5. Transistor 36 and transistor 38 operate in a similar manner to transistor 32 and transistor 34 of FIG. 3. The difference is that transistor 36 is gated by the control signal, STBY. This signal, which indicates a temporary halt of operation, is somewhat different from the use of a sleep signal, which indicates a longer inactive period. Transistor 40 of FIG. 4 is an N-channel transistor which has a drain connected to NODE 5, a source connected to the low voltage supply and a gate controlled by an inverse standby control signal, $\overline{STBY}$. Transistor 42 is a P-channel transistor having a source connected to NODE 5, and a drain and gate connected to the low voltage supply.

In standby mode, the control signal, STBY, is at a logic high. Thus, transistor 36 and transistor 40 are turned off and prevent leakage current by reducing the amount of leakage current as discussed above. Transistor 36 and transistor 40 can be constructed as low leakage current transistors in relation to the transistors in inverters 20 and logic transistors 18. Also during standby mode, transistor 38 and transistor 42 operate to limit the differences between NODE 4 and NODE 5 and the respective voltage supply. This limiting functionality allows quicker startup and less use of dynamic power during startup as discussed above. In addition, the use of leakage current reducing transistor 40 allows transistor 18 and transistors 16 to be low threshold voltage N-channel transistors to allow logic functions to be more quickly evaluated. Further, this allows transistor 14 to be a low voltage transistor as well. As an alternative, it should be understood that rather than having one set of leakage current reducing and keeper transistors for all dynamic logic stages 12, transistors could be distributed across each stage in which case there would be leakage current reducing transistors and keeper transistors for each dynamic logic stage 12.

In general, according to the present invention, a transistor can be placed in series between static logic gates within domino logic stages and the voltage supply. This transistor is gated by an appropriate signal, such as the inverse of the clock signal, a standby signal or a sleep signal. This transistor reduces the leakage current during precharge or standby to allow low threshold transistors to be used within the logic gates. Further, according to the present invention, a voltage keeper transistor can be placed on the intermediate node to limit the voltage swing away from the voltage supply. This allows the circuit to be started up more quickly and use less dynamic power. For low voltage application, use of low threshold voltage transistors in logic gates, such as inverters, should provide an advantage to the performance of the dynamic logic. Although there is some trade-off in increased area, the increase is somewhat small if a common line is used rather than reproducing transistors at each dynamic logic stage.

Although the present invention has been described in detail, it should be understood that various changes, substitutions and alterations can be made hereto without departing from the spirit and scope of the invention as defined by the appended claims. For example, different supply voltages could be used, different transistor types could be used, and the sense of signal high and signal low could be reversed.

What is claimed is:

1. An integrated dynamic logic circuit, comprising:

a logic gate having a high voltage end and a relatively low voltage end;

a dynamic node coupled to said high voltage end of said logic gate;

a first relatively high voltage supply terminal coupled to said high voltage end of said logic gate and said dynamic node and a second relatively low voltage supply terminal coupled to said low voltage end of said logic gate;

a first semiconductor device having a current path and a control electrode, one end of said current path connected to said first relatively high voltage supply terminal and the other end of said current path connected to said dynamic node;

relatively low threshold voltage circuitry coupled to said node having a relatively low threshold voltage and normally consuming standby leakage current; and a second relatively high threshold voltage semiconductor device having a current path coupled between said first relatively high voltage supply and said relatively low threshold voltage circuitry and having a control electrode, said second semiconductor device being turned off when said first semiconductor device is turned on and vice versa to reduce the standby leakage current of the logic gate.

2. The integrated circuit of claim 1, wherein:

said logic gate is in an evaluation phase when said first semiconductor device is non-conducting and said second semiconductor device is conducting;

the logic gate consuming standby leakage current when the dynamic logic gate is not in an evaluation phase.

3. An integrated circuit having a dynamic logic stage, comprising a logic gate coupled to a dynamic node of the dynamic logic stage, the logic gate having a first voltage supply terminal and a second voltage supply terminal; and a transistor having a source connected to a first voltage supply, a drain connected to the first voltage terminal of the logic gate, and a gate connected to a control signal, such that the drain of the transistor provides an intermediate node for supplying voltage to the logic gate;

the logic gate consuming standby leakage current; and the transistor turned off by the control signal, such that the transistor reduces the standby leakage current of the logic gate;

the logic gate consuming standby leakage current when the dynamic logic stage is not in an evaluation phase; and the transistor being turned off by the control signal when the dynamic logic stage is not in the evaluation phase;

wherein the logic gate consumes standby leakage current when the dynamic logic stage is in standby; and the transistor is turned off by the control signal when the dynamic logic stage is in standby.

4. The integrated circuit of claim 1, wherein the first semiconductor device is a P-channel transistor.

5. The integrated circuit of claim 1, wherein the relatively low threshold voltage circuitry is an inverter.

6. The integrated circuit of claim 5, wherein the inverter comprises:

a P-channel transistor having a source connected to the high voltage terminal of the inverter, a gate connected to the dynamic node, and a drain; and an N-channel transistor having a drain connected to the drain of the P-channel transistor, a gate connected to the dynamic node, and a source connected to the low voltage terminal of the inverter.

7. An integrated circuit having a dynamic logic stage, comprising:

a logic gate coupled to a dynamic node of the dynamic logic stage, the logic gate having a first voltage supply terminal and a second voltage supply terminal; and a transistor having a source connected to a first voltage supply, a drain connected to the first voltage terminal of the logic gate, and a gate connected to a control signal, such that the drain of the transistor provides an intermediate node for supplying voltage to the logic gate;

the logic gate consuming standby leakage current; and the transistor turned off by the control signal, such that the transistor reduces the standby leakage current of the logic gate;

wherein the control signal is substantially an inverse of a clock signal for the dynamic logic stage.

8. An integrated circuit having a dynamic logic stage, comprising:

a logic gate coupled to a dynamic node of the dynamic logic stage, the logic gate having a first voltage supply terminal and a second voltage supply terminal; and a transistor having a source connected to a first voltage supply, a drain connected to the first voltage terminal of the logic gate, and a gate connected to a control signal, such that the drain of the transistor provides an intermediate node for supplying voltage to the logic gate;

the logic gate consuming standby leakage current; and the transistor turned off by the control signal, such that the transistor reduces the standby leakage current of the logic gate;

wherein the control signal is a standby signal for the dynamic logic stage.

9. An integrated circuit having a dynamic logic stage, comprising:

a logic gate coupled to a dynamic node of the dynamic logic stage, the logic gate having a first voltage supply terminal and a second voltage supply terminal; and a transistor having a source connected to a first voltage supply, a drain connected to the first voltage terminal of the logic gate, and a gate connected to a control signal, such that the drain of the transistor provides an intermediate node for supplying voltage to the logic gate;

the logic gate consuming standby leakage current; and the transistor turned off by the control signal, such that the transistor reduces the standby leakage current of the logic gate;

wherein the control signal is a sleep signal for the dynamic logic stage.

10. An integrated circuit having a dynamic logic stage, comprising:

a logic gate coupled to a dynamic node of the dynamic logic stage, the logic gate having a first voltage supply terminal and a second voltage supply terminal; and a transistor having a source connected to a first voltage supply, a drain connected to the first voltage terminal of the logic gate, and a gate connected to a control signal. such that the drain of the transistor provides an intermediate node for supplying voltage to the logic gate;

the logic gate consuming standby leakage current; and the transistor turned off by the control signal, such that the transistor reduces the standby leakage current of the logic gate;

further comprising a second logic gate coupled to a dynamic node of the dynamic logic stage, the second logic gate having a first voltage supply terminal and a second voltage supply terminal, and the first voltage supply terminal of the second logic gate connected to the intermediate node, such that the transistor also reduces the standby leakage current of the second logic gate.

11. An integrated circuit, comprising:

a dynamic logic stage, an intermediate node, a source of clock signals for said dynamic logic stage and a source of control signals;

a first transistor for enabling said dynamic logic stage, the first transistor having a drain connected to the dynamic logic stage and intermediate node, a source connected to a first voltage supply and a gate connected to the source of clock signals for the dynamic logic stage; and a second relatively high transition voltage transistor having a source connected to said first voltage supply, a drain connected through a relatively low transition voltage circuit to said intermediate node, and a gate connected to said source of control signals, said intermediate node providing said first voltage supply for the dynamic logic stage when said first transistor is on or in the non-evaluation phase and said second transistor is off or in the non-evaluation phase;

the dynamic logic stage consuming standby leakage current when the dynamic logic stage is not in an evaluation phase; and the second transistor being turned off by the control signal when the dynamic logic stage is not in an evaluation phase to reduce the standby leakage current of the dynamic logic stage.

12. The integrated circuit of claim 11, further comprising a sub-circuit connected between the intermediate node and the first voltage supply, the sub-circuit limiting a voltage difference between the first voltage supply and the intermediate node to a predetermined amount.

13. An integrated circuit having a dynamic logic stage, comprising:

a first transistor used to enable a dynamic logic stage, the first transistor having a drain connected to the dynamic logic stage, a source connected to an intermediate node and a gate connected to a clock signal for the dynamic logic stage; and a second transistor having a source connected to a first voltage supply, a drain connected to the intermediate node, and a gate connected to a control signal, such that the intermediate node provides a first voltage supply for the dynamic logic stage;

the dynamic logic stage consuming standby leakage current when the dynamic logic stage is not in an evaluation phase;

the second transistor being turned off by the control signal when the dynamic logic stage is not in an evaluation phase, such that the second transistor reduces the standby leakage current of the dynamic logic stage; and a third transistor having a source connected to the intermediate node, a drain connected to the first voltage supply and a gate connected to the first voltage supply; the third transistor operating to limit the voltage difference between the first voltage supply and the intermediate node.

14. An integrated circuit having a dynamic logic stage, comprising:

a first transistor used to enable a dynamic logic stage, the first transistor having a drain connected to the dynamic logic stage, a source connected to an intermediate node and a gate connected to a clock signal for the dynamic logic stage; and a second transistor having a source connected to a first voltage supply, a drain connected to the intermediate node, and a gate connected to a control signal, such that the intermediate node provides a first voltage supply for the dynamic logic stage;

the dynamic logic stage consuming standby leakage current when the dynamic logic stage is not in an evaluation phase;

the second transistor being turned off by the control signal when the dynamic logic stage is not in an evaluation phase, such that the second transistor reduces the standby leakage current of the dynamic logic stage; and wherein the first voltage supply is a low voltage supply.

15. An integrated circuit having a dynamic logic stage, comprising:

a first transistor used to enable a dynamic logic stage, the first transistor having a drain connected to the dynamic logic stage, a source connected to an intermediate node and a gate connected to a clock signal for the dynamic logic stage; and a second transistor having a source connected to a first voltage supply, a drain connected to the intermediate node, and a gate connected to a control signal, such that the intermediate node provides a first voltage supply for the dynamic logic stage;

the dynamic logic stage consuming standby leakage current when the dynamic logic stage is not in an evaluation phase;

the second transistor being turned off by the control signal when the dynamic logic stage is not in an evaluation phase, such that the second transistor reduces the standby leakage current of the dynamic logic stage; and wherein the first transistor and the second transistor are N-channel transistors.

16. The integrated circuit of claim 13, wherein the third transistor is a P-channel transistor.

17. An integrated circuit having a dynamic logic stage, comprising:

a first transistor used to enable a dynamic logic stage, the first transistor having a drain connected to the dynamic logic stage, a source connected to an intermediate node and a gate connected to a clock signal for the dynamic logic stage; and a second transistor having a source connected to a first voltage supply, a drain connected to the intermediate node, and a gate connected to a control signal, such that the intermediate node provides a first voltage supply for the dynamic logic stage;

the dynamic logic stage consuming standby leakage current when the dynamic logic stage is not in an evaluation phase;

the second transistor being turned off by the control signal when the dynamic logic stage is not in an evaluation phase, such that the second transistor reduces the standby leakage current of the dynamic logic stage; and wherein the control signal is substantially an inverse of a standby signal for the dynamic logic stage.

18. An integrated circuit having a dynamic logic stage, comprising:

a first transistor used to enable a dynamic logic stage, the first transistor having a drain connected to the dynamic logic stage, a source connected to an intermediate node and a gate connected to a clock signal for the dynamic logic stage; and a second transistor having a source connected to a first voltage supply, a drain connected to the intermediate node, and a gate connected to a control signal, such that the intermediate node provides a first voltage supply for the dynamic logic stage;

the dynamic logic stage consuming standby leakage current when the dynamic logic stage is not in an evaluation phase;

the second transistor being turned off by the control signal when the dynamic logic stage is not in an evaluation phase, such that the second transistor reduces the standby leakage current of the dynamic logic stage; and wherein the control signal is substantially an inverse of a sleep signal for the dynamic logic stage.

19. An integrated circuit having a dynamic logic stage, comprising:

a first transistor used to enable a dynamic logic stage, the first transistor having a drain connected to the dynamic logic stage, a source connected to an intermediate node and a gate connected to a clock signal for the dynamic logic stage; and a second transistor having a source connected to a first voltage supply, a drain connected to the intermediate node, and a gate connected to a control signal, such that the intermediate node provides a first voltage supply for the dynamic logic stage;

the dynamic logic stage consuming standby leakage current when the dynamic logic stage is not in an evaluation phase;

the second transistor being turned off by the control signal when the dynamic logic stage is not in an evaluation phase such that the second transistor reduces the standby leakage current of the dynamic logic stage; and further comprising a third transistor used to enable a second dynamic logic stage, the third transistor having a drain connected to the second dynamic logic stage, a source connected to the intermediate node and a gate connected to the clock signal, such that the second transistor also reduces the standby leakage current of the second dynamic logic stage.

20. An integrated circuit having a dynamic logic stage, comprising:

a first voltage supply;

a clocked relatively high threshold voltage transistor forming part of the dynamic logic stage, the clocked transistor having a source, a drain and a clocked gate; and a second relatively low threshold voltage transistor having a source connected to said first voltage supply, a drain connected to the source of the clocked transistor, and a gate connected to a control signal, the drain of the second transistor providing an intermediate node for supplying voltage to the clocked transistor;

the clocked transistor consuming standby leakage current; and the second transistor turned off by the control signal, such that the second transistor reduces the standby leakage current of the logic gate.

21. An integrated circuit having a dynamic logic stage, comprising:

a clocked transistor forming part of the dynamic logic stage, the clocked transistor having a source and a drain; and a second transistor having a source connected to a first voltage supply, a drain connected to the source of the clocked transistor, and a gate connected to a control signal, such that the drain of the second transistor provides an intermediate node for supplying voltage to the clocked transistor;

the clocked transistor consuming standby leakage current; and the second transistor turned off by the control signal, such that the second transistor reduces the standby leakage current of the logic gate;

the clocked transistor consumes standby leakage current when the dynamic logic stage is not in an evaluation phase; and the second transistor is turned off by the control signal when the dynamic logic stage is not in the evaluation phase.

22. An integrated circuit having a dynamic logic stage, comprising:

a clocked transistor forming part of the dynamic logic stage, the clocked transistor having a source and a drain; and a second transistor having a source connected to a first voltage supply, a drain connected to the source of the clocked transistor, and a gate connected to a control signal, such that the drain of the second transistor provides an intermediate node for supplying voltage to the clocked transistor;

the clocked transistor consuming standby leakage current; and the second transistor turned off by the control signal, such that the second transistor reduces the standby leakage current of the logic gate;

the clocked transistor consumes standby leakage current when the dynamic logic stage is in standby; and the second transistor is turned off by the control signal when the dynamic logic stage is in standby.

23. A method for reducing standby leakage current through a logic gate connected to a dynamic logic stage, comprising:

connecting a relatively high threshold voltage leakage current reducing transistor to a first voltage supply, the leakage current reducing transistor providing a controllable current path between the high voltage supply and an intermediate node;

connecting a first voltage terminal of a relatively low threshold voltage logic gate to the intermediate node, the logic gate consuming standby leakage current; and turning off the current path of the leakage current reducing transistor, such that the leakage current reducing transistor reduces the standby leakage current of the logic gate.

24. The method of claim 23, wherein:

the logic gate consumes standby leakage current when the dynamic logic stage is not in an evaluation phase; and the current path of the leakage current reducing transistor is turned off when the dynamic logic stage is not in an evaluation phase.

25. A method for reducing standby leakage current through a logic gate connected to a dynamic logic stage, comprising:

connecting a leakage current reducing transistor to a first voltage supply, the leakage current reducing transistor providing a controllable current path between the high voltage supply and an intermediate node;

connecting a first voltage terminal of a logic gate to the intermediate node, the logic gate consuming stand by leakage current; and turning off the current path of the leakage current reducing transistor, such that the leakage current reducing transistor reduces the standby leakage current of the logic gate;

the logic gate consuming standby leakage current when the dynamic logic stage is in standby; and the current path of the leakage current reducing transistor being turned off when the dynamic logic stage is in standby.

26. A method for reducing standby leakage current through a logic gate connected to a dynamic logic stage, comprising:

connecting a leakage current reducing transistor to a first voltage supply, the leakage current reducing transistor providing a controllable current path between the high voltage supply and an intermediate node;

connecting a first voltage terminal of a logic gate to the intermediate node, the logic gate consuming stand by leakage current; and turning off the current path of the leakage current reducing transistor, such that the leakage current reducing transistor reduces the standby leakage current of the logic gate;

further comprising limiting a voltage difference between the first voltage supply and the intermediate node.

27. The method of claim 26, wherein limiting is accomplished by connecting a keeper transistor between the first voltage supply and the intermediate node, such that the keeper transistor operates to limit the voltage difference between the first voltage supply and the intermediate node.

28. An integrated circuit which comprises:

a voltage source having a relatively high voltage terminal and a relatively low voltage terminal;

a logic circuit coupled across said voltage source including a logic gate and a pair of clock operated switches, one of said pair of switches at opposite ends of said logic gate, said logic gate connected in series with said pair of switches and having a dynamic node at the junction of said logic circuit and one of said clock operated switches at the high voltage end of said logic gate;

a relatively high threshold voltage switch coupled at one end thereof to said relatively high voltage terminal;

circuitry under control of said node having a relatively low threshold voltage coupled at one end thereof to the other end of said relatively high threshold voltage switch and at the other end thereof to said relatively low voltage terminal.

29. The circuit of claim 28 wherein said circuitry is an inverter.

30. The circuit of claim 28 wherein said pair of switches are alternately conducting or non-conducting.

31. The circuit of claim 29 wherein said pair of switches are concurrently conducting or non-conducting.

32. The circuit of claim 31 wherein said relatively high threshold voltage switch is conducting when the one of said pair of switches that is at the high voltage end is non-conducting.

* * * * *